United States Patent [19]
Parkinson

[11] Patent Number: 5,889,415
[45] Date of Patent: Mar. 30, 1999

[54] INTERNAL VOLTAGE REFERENCED OUTPUT DRIVER

[75] Inventor: Thomas DeVon Parkinson, Albuquerque, N. Mex.

[73] Assignee: Philips Electronics North America Corporation, New York, N.Y.

[21] Appl. No.: 773,120

[22] Filed: Dec. 26, 1996

[51] Int. Cl.⁶ .............................................. H03K 19/0185
[52] U.S. Cl. ................................................. 326/68; 326/83
[58] Field of Search .................................. 326/31, 34, 62, 326/68, 83, 86; 327/333, 170, 391

[56] References Cited

U.S. PATENT DOCUMENTS

| | | | |
|---|---|---|---|
| 5,047,657 | 9/1991 | Seevinck et al. | 326/68 |
| 5,223,751 | 6/1993 | Simmons et al. | 326/83 |
| 5,280,204 | 1/1994 | Livolsi | 326/83 |
| 5,422,523 | 6/1995 | Roberts et al. | 326/68 |
| 5,541,534 | 7/1996 | Cao et al. | 326/81 |
| 5,594,361 | 1/1997 | Campbell | 326/24 |
| 5,614,859 | 3/1997 | Ong | 327/333 |

FOREIGN PATENT DOCUMENTS

0546724a2  6/1993  European Pat. Off. ... H03K 19/0175

*Primary Examiner*—Jon Santamauro
*Assistant Examiner*—Don Phu Le
*Attorney, Agent, or Firm*—Brian J. Wieghaus

[57] ABSTRACT

An internal voltage referenced output driver is disclosed which is capable of generating any intermediate output level between a first and second voltage supply. The driver includes a dynamic stage which asserts, responsive to a first input voltage being asserted on a driver input terminal, a first output voltage on a driver output terminal, a disabling signal on an enabling terminal, and a stabilizing signal on the stabilizer terminal. Responsive to a second input voltage being asserted on the driver input terminal, the dynamic stage ceases to assert the first output voltage on the driver output terminal, asserts a release signal on the stabilizer terminal, and asserts an enabling signal on the enabling terminal. The driver further includes a static stage which, responsive to the enabling signal and the release signal, asserts a second output voltage on the driver output terminal.

48 Claims, 5 Drawing Sheets

5,889,415

INTERNAL VOLTAGE REFERENCED OUTPUT DRIVER

BACKGROUND OF THE INVENTION

The present invention relates generally to digital electronic circuits and more particularly to the digital drivers used to generate the logic signals used by those circuits.

Typically, modern digital circuits include devices from many different digital logic families, such as transistor-transistor logic (TTL), metal-oxide semiconductor (MOS) and complimentary metal-oxide semiconductor (CMOS). It is often desirable to combine different families within a single system, or even a single chip. A problem exist, however, in that each family has unique characteristics and requirements, such as supply voltages and output levels, and using a high voltage device output level to drive a low voltage device could damage the low voltage device.

Many systems deal with this problem by using a mixed power supply having for example a 5 V terminal and 2.5 V terminal. FIG. 1 shows a typical prior art CMOS driver 100, using a mixed power supply (Vcc1, Vcc2), to generate an output at the lower (Vcc2) voltage level. Driver 100 includes an input terminal 102, a first PMOS transistor 104, a first NMOS transistor 106, a second PMOS transistor 108, a second NMOS transistor 110, a conductor 112, a first voltage supply terminal 114, a second voltage supply terminal 116, a ground terminal 118, and an output terminal 120.

First PMOS transistor 104 has a source terminal 122 connected to first voltage supply terminal 114, a drain terminal 124 connected to conductor 112, and a gate terminal 126 connected to input terminal 102. First NMOS transistor 106 has a drain terminal 128 connected to conductor 112, a source terminal 130 connected to ground terminal 118, and a gate terminal connected to input terminal 102. Second PMOS transistor 108 has a source terminal 134 connected to second voltage supply terminal 116, a drain terminal 136 connected to output terminal 120, and a gate terminal 138 connected to conductor 112. Second NMOS transistor 110 has a drain terminal 140 connected to output terminal 120, a source terminal 142 connected to ground terminal 118, and a gate terminal 144 connected to conductor 102.

When the voltage at input terminal 102 is low, first PMOS transistor 104 is "on," so that its drain terminal 124 and conductor 112 are pulled up near Vcc1, the voltage on first voltage supply terminal 114. The low voltage on input terminal 102 also turns first NMOS transistor 106 "off," so that no current flows from conductor 112 through transistor 106 to ground. Since the voltage on conductor 112 is near Vcc1, second NMOS transistor 110 is "on" and pulls its drain 140 and output terminal 120 near ground. The high voltage on conductor 112 also turns second PMOS transistor 108 "off," so that no current flows from second voltage supply terminal 116 to output terminal 120. Thus, responsive to a logical low voltage on input terminal 102, driver 100 produces a logical low voltage on output terminal 120.

When input terminal 102 is brought to a high voltage, however, first NMOS transistor 106 is turned "on" so that its drain terminal 128 and conductor 112 are pulled near ground. The high signal on input terminal 102 also turns first PMOS transistor 104 "off" so that no current flows from first supply voltage terminal 114 through transistor 104 to conductor 112. The low voltage on conductor 112 turns second PMOS transistor 108 "on," pulling its drain terminal 136 near Vcc2, and turns second NMOS transistor 110 "off" so that no current can flow from output terminal 120 through transistor 110 to ground terminal 118. Thus, responsive to a logical high voltage on input terminal 102, driver 100 produces a logical high voltage, very close to Vcc2, on output terminal 120.

Using a mixed power supply is not, however, a total solution. First, it is undesirable to increase the number of supply pins that must be provided on an integrated circuit chip. Further, it would be impractical to provide a separate supply terminal for every possible voltage level.

Intermediate voltages can sometimes be produced using diodes, but often the desired voltage level is not an integral number of diode voltage drops from a supply level. For example, if an output voltage of 4.0 V is required, and the power supply has a 5.0 V pin, one diode drop would produce a (5 V–0.6 V=) 4.4 V output and two diode drops would produce a 3.8V output, neither achieving the desired 4.0V.

Generally, the amount of static current required for the on-chip production of output voltages is roughly equivalent to the amount of static current required at the output. This amount of static current is usually unacceptable from the standpoint of power dissipation. Further, it is desirable that the static current required to produce each output voltage be much smaller than the output current requirements. Therefore, what is needed is a driver that generates, on-chip, the intermediate voltages used to drive the outputs, and whose static current requirements are far less than its output current requirements.

SUMMARY OF THE INVENTION

The present invention is an internal voltage referenced output driver. The driver includes a first voltage supply terminal, a second voltage supply terminal, a driver input terminal, and a driver output terminal. A first input voltage on the driver input terminal causes the driver to assert a first output voltage on the driver output terminal, and a second input voltage on the driver input terminal causes it to assert a second output voltage on the output terminal. Typically, the first output voltage will be at or near one of the supply voltages. The second output voltage can be any voltage between the first and second supply voltages.

The driver is functionally divided into a dynamic stage and a static stage interconnected via an enable terminal and a stabilizer terminal. The first input voltage being asserted on the driver input terminal causes the dynamic stage to assert the first output voltage on the driver output terminal, a disabling signal on the enabling terminal, and a stabilizing signal on the stabilizer terminal. The second input voltage being asserted on the driver input terminal causes the dynamic stage to cease asserting the first output voltage on the driver output terminal, to assert a release signal on the stabilizer terminal, and to assert an enabling signal on the enabling terminal, thus enabling the static stage to assert the second output voltage on the driver output terminal.

The dynamic stage includes a first output driver, an output voltage limiter, a stabilization voltage generator, a current limiter, and an enabling voltage generator. The first output driver is coupled to the driver input terminal and the driver output terminal and asserts, responsive to the first input voltage on the driver input terminal, the first output voltage on the driver output terminal. The driver output terminal being at the first output voltage causes the enabling voltage generator to assert the disabling voltage on the enabling terminal. The disabling voltage being asserted on the enabling terminal causes the stabilization voltage generator to assert a stabilizing voltage on the stabilizer terminal. The stabilizer terminal asserting the stabilization voltage causes the output voltage limiter to provide operating current to the first output driver. The disabling voltage and a signal from the first output driver together cause the current limiter to provide operating current to the enabling voltage generator.

The static stage includes a second output driver, an enabler, a stabilizer, a feedback device, and an overshoot protector. The stabilizer terminal asserting the stabilization voltage causes the stabilizer to clamp the second output driver into a stable state. The enabling terminal asserting the disabling voltage causes the enabler to prevent the second output driver from asserting the second output voltage on the driver output terminal.

When a second input voltage is asserted on the driver input terminal, the first output driver causes the voltage on the driver output terminal to begin transitioning from the first to the second output voltage. This transition causes the enabling voltage generator to assert an enabling voltage on the enabling terminal, which in turn causes the current limiter to cut off the current supply to the enabling voltage generator, and to control the stabilization voltage generator to assert a releasing voltage on the stabilizer terminal. The releasing voltage cuts off the operating current to the first output driver, preventing the first output driver from pulling the voltage on the driver output terminal all the way to the first supply voltage.

The enabling terminal asserting the enabling voltage causes the enabler to enable the second output driver to assert the second output voltage on the driver output terminal. The stabilizer terminal asserting the releasing voltage causes the stabilizer to unclamp the second output driver, which leaves the second output driver responsive to the feedback device. The feedback device provides feedback from the driver output terminal to the second output driver to stabilize the driver output terminal at the desired second output voltage, which is determined by the characteristics of the feedback device. If, during the transition from the first output voltage to the second output voltage, the driver output terminal voltage substantially overshoots the second output voltage, then the overshoot protector pulls the driver output terminal voltage back toward the second output voltage.

DETAILED DESCRIPTION OF THE PREFERRED EMBODIMENT

The present invention is an internal voltage referenced output driver. The following description of the preferred embodiment sets forth numerous specific details, such as the designs of the voltage and current references, to provide a thorough understanding of the invention. It will be obvious, however, to those skilled in the art that the invention can be practiced apart from these specific details. In other instances, well-known electronic circuit designs and techniques are not set forth in detail so as not to obscure the present invention.

Figure 1:
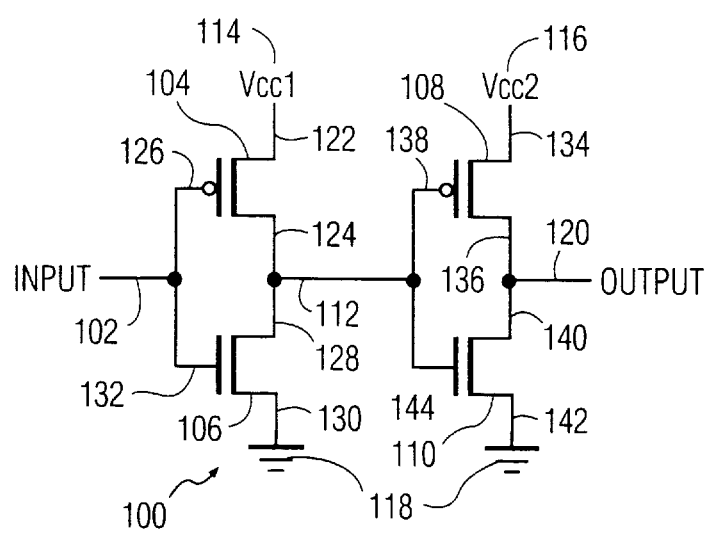
FIG. 1 is a schematic diagram of a prior art driver.
Figure 2:
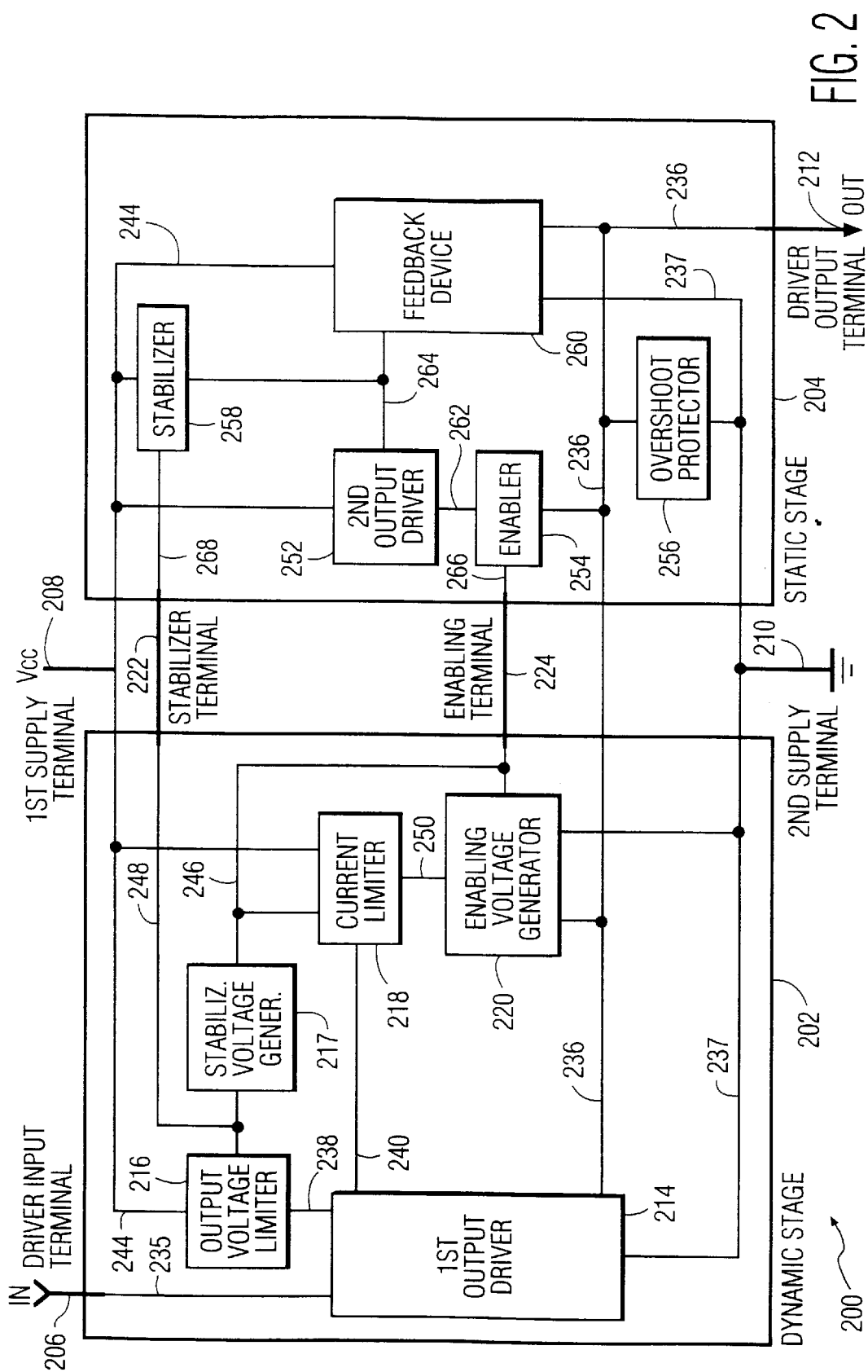
FIG. 2 is a block diagram of the internal voltage referenced output driver of the present invention.

FIG. 2 shows a block diagram of the preferred driver 200 embodiment of the invention, including a dynamic stage 202, a static stage 204, a driver input terminal 206, a first voltage supply terminal 208, a second voltage supply terminal 210, and a driver output terminal 212. First and second voltage supply terminals 208, 210 provide power to driver 200, and are supplied by an external power supply at, for example, 5 V and 0 V (ground), respectively. Driver 200 receives digital (i.e., logical "high" and "low") signals on driver input terminal 206, and in response asserts digital output signals on driver output terminal 212. In particular, responsive to a first input voltage (e.g. logical low), driver 200 asserts a first output voltage (e.g. logical low) on driver output terminal 212, and, responsive to a second input voltage (e.g. logical high), driver 200 asserts a second output voltage on driver output terminal 212. Generally, the high and low logic levels are very close to the first and second supply voltages, but due to the novel characteristics of driver 200, the second output voltage can be at any intermediate level between the first and second supply voltages.

Dynamic stage 202 includes a first output driver 214, an output voltage limiter 216, a stabilization voltage generator 217, a current limiter 218, an enabling voltage generator 220, a stabilizer terminal 222, and an enabling terminal 224, variously intercoupled by a plurality of nodes. As used herein, the term "node" refers to a group of one or more conductors coupled electrically to be at substantially the same electrical potential. First output driver 214 is coupled via node 235 to driver input terminal 206, via node 236 to enabling voltage generator 220 and to driver output terminal 212, via node 237 to enabling voltage generator 220 and to second supply terminal 210, via node 238 to output voltage limiter 216, and via node 240 to current limiter 218. Output voltage limiter 216 is further coupled, via node 248, to stabilization voltage generator 217 and stabilizer terminal 222 and, via node 244, to current limiter 218 and to first supply terminal 208. Stabilization voltage generator 217 is further coupled, via node 246, to current limiter 218, enabling voltage generator 220, and enabling terminal 224. Current limiter 218 is further coupled, via node 250, to enabling voltage generator 220.

Static stage 204 includes a second output driver 252, an enabler 254, an overshoot protector 256, a stabilizer 258, and a feedback device 260. Second output driver 252 is coupled via node 244 to first supply terminal 208, to stabilizer 258 and to feedback device 260, via node 262 to enabler 254, and via node 264 to stabilizer 258 and feedback device 260. Enabler 254 is further coupled, via node 266, to enabler terminal 224 and, via node 236, to driver output terminal 212, overshoot protector 256, and feedback device 260. Overshoot protector 256 is further coupled via node 237 to feedback device 260 and to second supply terminal 212. Stabilizer 258 is further coupled via node 268 to stabilizer terminal 222.

Binary digital signals (logical "high" or "low") are received by driver 200 via input terminal 206. When an external circuit asserts a first input voltage (e.g., logical low) on driver input terminal 206, the voltage is communicated via node 235 to first output driver 214 which, in response, asserts a first output voltage (e.g., logical low), via node 236, on driver output terminal 212. Responsive to the first output voltage on node 236, enabling voltage generator 220 asserts a disabling signal on node 246, via enabling terminal 224 to node 266, causing enabler 254 to disable static stage 204.

Also responsive to the disabling signal on node 246, stabilization voltage generator 217 asserts a first stabilization voltage on node 248, which is communicated, via stabilizer terminal and node 268, to stabilizer 258. Responsive to the first stabilization voltage on node 268, stabilizer 258 asserts a controlling voltage on node 264 which stabilizes second output driver 252. Also responsive to the stabilization voltage on node 248, output voltage limiter 216 asserts a first limiting voltage on node 238, thus enabling first output driver 214 to drive driver output terminal 212 to the desired first output voltage.

When an external device asserts a second input voltage (e.g., logical high) on driver input terminal 206, the voltage is communicated via node 235 to first output driver 214 which, in response, attempts to raise the voltage on node 236, and thus driver output terminal 212, to a level near the first supply voltage. However, at some point during the transition towards the first supply voltage, node 236 reaches a threshold voltage, responsive to which enabler 220 asserts an enabling voltage on node 246. The enabling voltage on node 246 causes current limiter 218 to limit the amount of current flowing from first supply terminal 208, via node 244, through current limiter 218, and, via node 250, to enabler 220, thus limiting unnecessary power consumption. The enabling voltage on node 246 also causes stabilizer 217 to assert a second stabilization voltage on node 248. Responsive to the second stabilization voltage on node 248, output voltage limiter 216 asserts a second limiting voltage on node 238 which disables first output driver 214.

The second stabilization voltage on node 248 is communicated, via stabilizer terminal 222, to node 268, causing stabilizer 258 to cease asserting any voltage on node 264. The enabling voltage on node 246 is communicated via enabling terminal 224 to node 266, which causes enabler 254 to permit second output driver 252 to assert the second output voltage, via node 262 and through enabler 254, on node 236 and driver output terminal 212

Any desired second output voltage, between the first and second supply voltages, can be attained by modifying the characteristics of feedback device 260. The level of the second output voltage asserted by second output driver 252 is controlled by the voltage on node 264. Feedback device 260 responds to voltage changes on node 236 by altering the voltage on node 264 to maintain the desired second output voltage level.

The division of driver 200, based on functionality, into dynamic stage 202 and static stage 204 is for illustrative purposes. Those skilled in the art will understand that no actual division into stages is required from an operational standpoint, as long as the necessary individual components are present.

Figure 3:
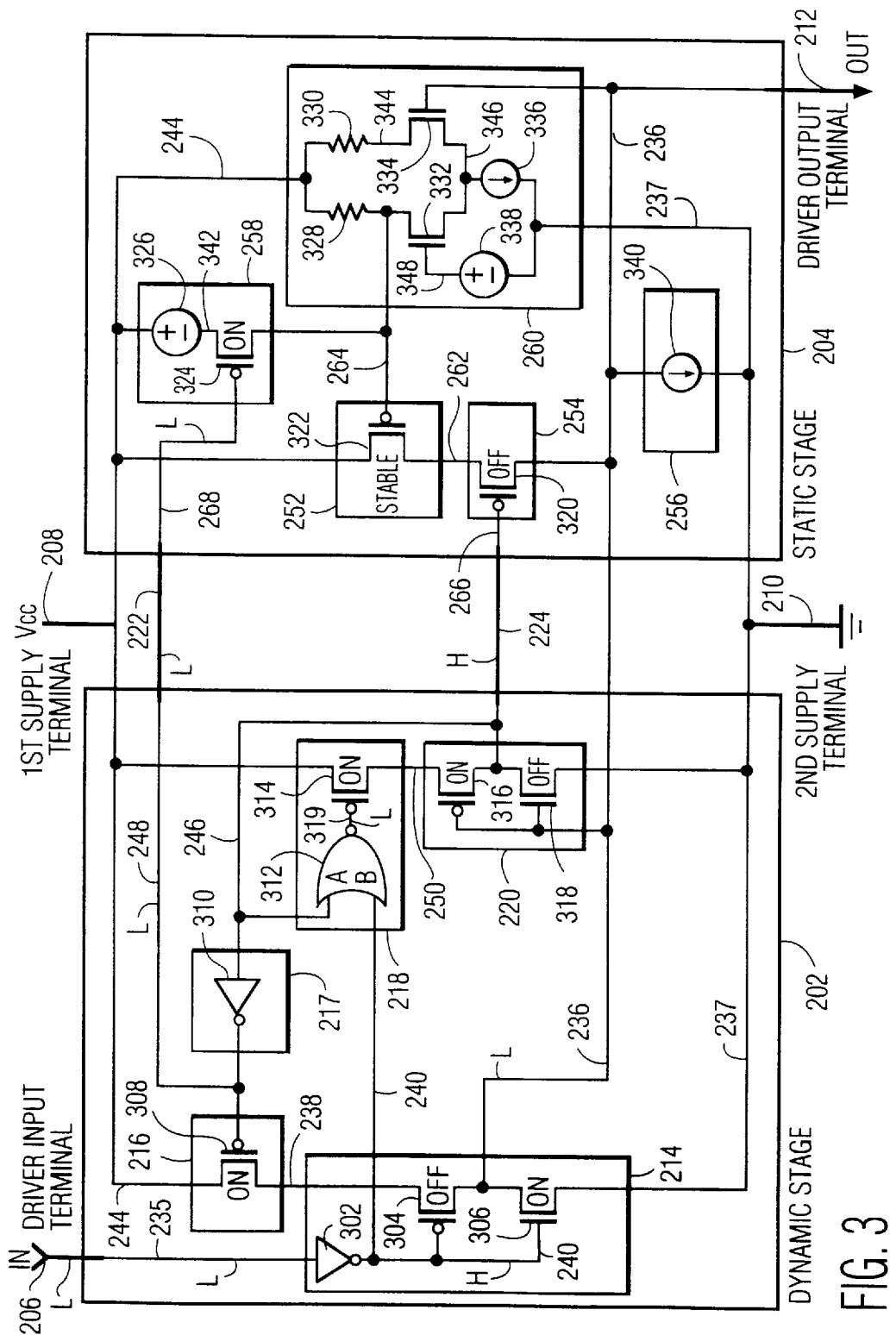
FIG. 3 is a schematic diagram of the internal voltage referenced output driver of the present invention with "low" input.

FIG. 3 is a schematic drawing detailing driver 200 and indicating the logic levels of the various nodes when a low voltage is asserted on driver input terminal 206. In dynamic stage 202, first output driver 214 includes a first inverter 302, a first PMOS transistor 304, and a first NMOS transistor 306. Output voltager limiter 216 is a second PMOS transistor 308, and stabilization voltage generator 217 is a second inverter 310. Current limiter 218 includes a NOR gate 312 and a third PMOS transistor 314. Enabling voltage generator 220 includes a fourth PMOS transistor 316 and a second NMOS transistor 318.

Inverter 302 has an input terminal coupled to node 235 and an output terminal coupled to node 240. First PMOS transistor 304 has a source terminal coupled to node 238, a drain terminal coupled via node 236 to driver output terminal 212, and a gate terminal coupled to node 240. First NMOS transistor 306 has a drain terminal coupled via node 236 to driver output terminal 212, a source terminal coupled via node 237 to the second supply terminal 210, and a gate terminal coupled to node 240. Second PMOS transistor 308 has a source terminal coupled via node 244 to the first supply terminal 208, a drain terminal coupled to node 238, and a gate terminal coupled to node 248. Second inverter 310 has an input terminal coupled to node 246 and an output terminal coupled to node 248. NOR gate 312 has a first (A) input terminal coupled to node 246, a second (B) input terminal coupled to node 240, and an output terminal coupled to a node 319. Third PMOS transistor 314 has a source terminal coupled via node 244 to first supply terminal 208, a drain terminal coupled to node 250, and gate terminal coupled to node 319. Fourth PMOS transistor 316 has a source terminal coupled to node 250, a drain terminal coupled to node 246, and a gate terminal coupled to node 236. Second NMOS transistor 318 has a drain terminal coupled to node 246, a source terminal coupled via node 237 to the second supply terminal 210, and a gate terminal coupled to node 236.

In static stage 204, enabler 254 is an enabling PMOS transistor 320, and second output driver 252 is a driving PMOS transistor 322. Stabilzer 258 includes a stabilizing PMOS transistor 324 and a first voltage reference 326. Feedback device 260 includes a first resistor 328, a second resistor 330, a first amplifying NMOS transistor 332, a second amplifying NMOS transistor 334, a first current reference 336 and a second voltage reference 338. Overshoot protector 256 is a second current reference 340.

Enabling PMOS transistor 320 has a source terminal coupled to node 262, a drain terminal coupled to node 236, and a gate terminal coupled via node 266 to enabler terminal 224. Driving PMOS transistor 322 has a source terminal coupled via node 244 to first supply terminal 208, a drain terminal coupled to node 262, and a gate terminal coupled to node 264. Stabilizing PMOS transistor 324 has a source terminal coupled to node 342, a drain terminal coupled to node 264, and a gate terminal coupled via node 268 to stabilizer terminal 222. First resistor 328 has a first terminal coupled to node 244 and a second terminal coupled to node 264. Second resistor 330 has a first terminal coupled to node 244 and a second terminal coupled to node 344. First amplifying NMOS transistor 332 has a drain terminal coupled to node 264, a source terminal coupled to node 346, and a gate terminal coupled to node 348. Second amplifying NMOS transistor 334 has a drain terminal coupled to node 344, a source terminal coupled to node 346, and a gate terminal coupled to node 236. First current reference 336 has a first terminal coupled to node 346 and a second terminal coupled to node 237. Second voltage reference 338 has a first terminal coupled to node 348, and a second terminal coupled to node 237. Second current reference 340 has a first terminal coupled to node 236, and a second terminal coupled to node 237.

Input Low

Referring now to the operation of dynamic stage 202, PMOS transistor 304 and NMOS transistor 306 together function as an inverter, having an input terminal at node 240 and an output terminal at node 236. Thus, inverter 302, PMOS transistor 304, and NMOS transistor 306 together function as a double-inverter driver. When a low input signal is asserted on driver input terminal 206, node 235 pulls the input terminal of inverter 302 low, causing inverter 302 to assert a high voltage on node 240. The high voltage on node 240 turns PMOS transistor 304 off and turns NMOS transistor 306 on, which pulls node 236 close to the second supply 210 potential (ground) and thus asserts the first output voltage (low) on driver output terminal 212.

NOR gate 312 and PMOS transistor 314 together function to control current flow through transistors 314, 316 and 318. Node 240 drives the second (B) input of NOR gate 312 high, causing NOR gate 312 to assert a low voltage on node 319, which turns on PMOS transistor 314, allowing current to flow.

PMOS transistor 316 and NMOS transistor 318 together function as an inverter, having an input terminal at node 236, and an output terminal at node 246 which asserts an enabling signal on enabling terminal 224. The low voltage on node 236 turns off NMOS transistor 318, and turns on PMOS transistor 316. With PMOS transistors 314 and 316 on and NMOS transistor 318 off, node 246 and enabling terminal 224 are pulled high.

Inverter 310 serves as a stabilization signal generator. The high voltage on node 246 drives high the input terminal of inverter 310, which asserts a low voltage on node 248 and thus on stabilizer terminal 222.

PMOS transistor 308 limits the voltage asserted on node 236 by transistors 304 and 306. The low voltage on node 248 turns on PMOS transistor 308, but, since PMOS transistor 304 is off, no current flows through PMOS transistor 308 until the voltage asserted on the driver input terminal 206 transitions from low to high, as will be explained.

Referring now to the operation of static stage 204, driving PMOS transistor 322 acts as a transconductance device, asserting a second output voltage, through enabling PMOS transistor 320, on node 236 and driver output terminal 212. The level of the second output voltage depends on the voltage applied to the gate terminal of transistor 322. When enabled, transistor 322 typically operates with its gate terminal near its threshold voltage. However, since the dynamic stage 202 is asserting a high signal on enabling terminal 224 and node 266, transistor 320 is off, effectively isolating driving transistor 322 from node 236 and driver output terminal 212.

Resistors 328 and 330, transistors 332 and 334, and current reference 336 function together as a differential amplifier, having inputs at nodes 348 and 236, and an output at node 264, and together with voltage reference 338 provide feedback from node 236 to the gate of driving transistor 322 at node 264. Current reference 336 allows a constant current (I) to flow from the first supply terminal 208, via node 244, through resistors 328 and 330 and transistors 332 and 334, and, via node 237, to second supply terminal 210. Due to the parallel disposition of resistor 328 and transistor 332 with respect to resistor 330 and transistor 334, each resistor 328 and 330 conducts a portion of the total current (I) passing through current reference 336.

Voltage reference 338 maintains node 348 at a constant voltage, which is largely responsible for determining the second output voltage of driver 200. Since the current flow through each resistor 328 and 330 depends on the relative conductances of transistors 332 and 334 respectively, the amplifier output at node 264 depends on the voltage difference between nodes 348 and 236. For example, if the voltages on the gates of transistors 332 and 334 are roughly equal, then, assuming that the resistances of resistors 328 and 330 are roughly equal, roughly half of the constant current (I) will flow through each resistor 328 and 330. Therefore, the voltage drop (V1) across resistor 328 will be one-half of the constant current (I) multiplied by the resistance (R) of resistor 328 (V1=IR/2), and the voltage (V) at node 264 will equal the first supply voltage minus the drop across resistor 328 (V=Vcc−V1). If the voltage at node 236 drops such that less current flows through resistor 330 and more current flows through resistor 328, then the voltage drop across resistor 328 will increase, and the voltage (V) at node 264 will decrease. On the other hand, if the voltage on node 236 rises such that more current flows through resistor 330 and less current flows through resistor 328, then the voltage drop across resistor 328 will decrease, and the voltage (V) at node 264 will increase.

When the dynamic stage 202 is driving node 236 low, the differential amplifier will attempt to drive node 264 close to the second supply voltage. To prevent such large voltage swings on the gate of driving transistor 322, stabilizing PMOS transistor 324 and voltage reference 326 together function as a stabilizer 258. Voltage reference 326 maintains node 342 at a constant voltage selected to be near the threshold voltage of driving PMOS transistor 322. The low voltage on stabilizer terminal 222, via node 268, turns on PMOS transistor 324 which holds node 264 near the threshold voltage on node 342, thus preventing large voltage swings on the gate of driving transistor 322 when the static stage 204 transitions from disabled to enabled.

Second current reference 340 prevents the voltage on driver output terminal 212 from overshooting the second output voltage, and is essentially non-functional when dynamic stage 202 is asserting the first output voltage on node 236 and driver output terminal 212.

Input Goes High

Figure 4:
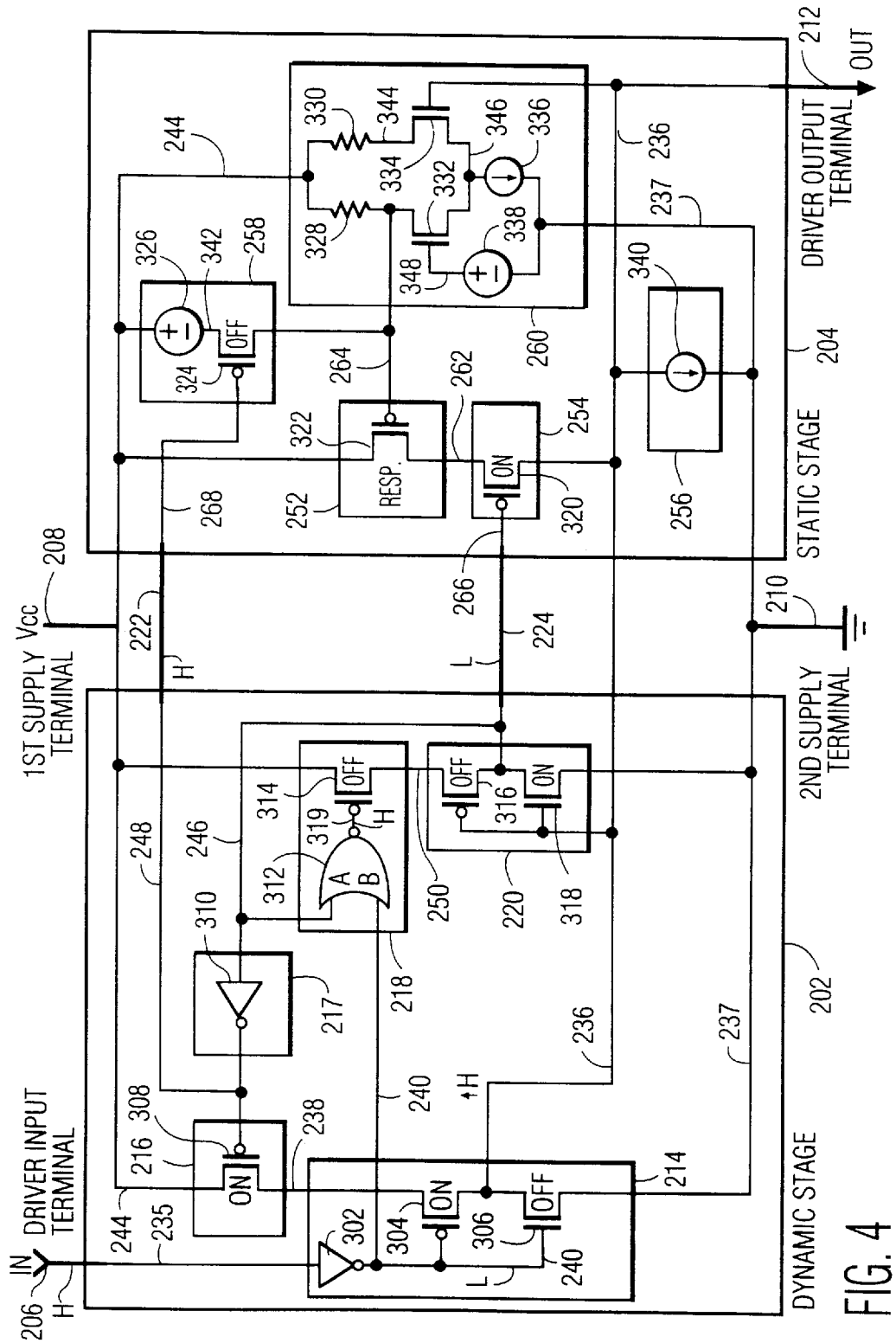
FIG. 4 is a schematic diagram of the internal voltage referenced output driver of the present invention with "high" input.

FIG. 4 shows driver 200 when a second input voltage (high) is asserted on driver input terminal 206. The high voltage is communicated via node 235 to the input terminal of inverter 302 which asserts a low voltage on node 240 to turn transistor 306 off and transistor 304 on. Since transistor 308 remains on from the previous state of driver 200, transistor 304 begins to pull node 236 toward the first supply voltage (Vcc). At some point during the transition, the voltage on node 236 will exceed the threshold voltage of the enabling voltage generator 220, at which point transistor 318 will be on and transistor 316 will be partially off. Transistor 318, when on, pulls node 246 and enabler terminal 224 low. The low voltage on node 246 causes inverter 310 to assert a high signal on node 248 and stabilizer terminal 222. The high signal on node 248 turns off transistor 308 and prevents transistor 304 from pulling node 236 any higher. Nodes 246 and 240 also pull the first and second (A and B) input terminals of NOR gate 312 low, causing the NOR gate 312 output terminal to go high, turning transistor 314 off, and preventing current from flowing through partially-on transistor 316. At this point, dynamic stage 202 has pulled the voltage on node 236 up to the threshold voltage of the enabling voltage generator 220, is asserting a low signal on enabling terminal 224 and a high signal on stabilizer terminal 222, and has disabled the devices responsible for asserting the first output voltage on node 236.

The static stage 204 is now enabled. The low signal on enabling terminal 224 and node 266 turns on enabling transistor 320, thus enabling driving transistor 322 to assert the second output voltage, through transistor 320, on node 236. The high signal on stabilizer terminal 222 and node 268 turns off transistor 324, thus releasing control of node 264, and the gate terminal of driving transistor 322, to the differential amplifier.

At this point, the voltage on node 236 and driver output terminal 212 will be near the desired second output voltage, as determined by voltage reference 338. If node 236 is at a lower voltage than node 348, the differential amplifier 260 will decrease the voltage at node 264, thus increasing the conductance of transistor 322 and, therefore, the voltage asserted on node 236 by transistor 322. If node 236 is at a higher voltage than node 348, the differential amplifier 260 will increase the voltage at node 264, thus decreasing the conductance of transistor 322 and allowing overshoot protector 256 to pull the voltage on node 236 toward the desired second output voltage. The amplifier feedback continues until node 236 stabilizes at the desired second output voltage.

Second current reference 340 provides protection in case the voltage on node 236 substantially overshoots the desired second output voltage. In that case, current reference 340 sinks a constant current to pull the voltage on node 236 back toward the second supply voltage. The constant current value should be set based on how quickly overshoots must be corrected and the acceptable level of static current.

Figure 5:
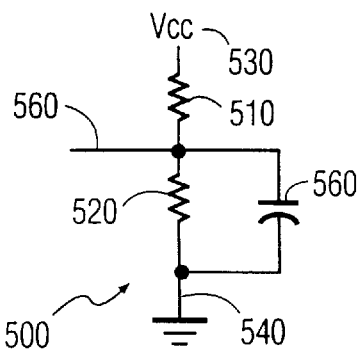
FIG. 5 is a schematic diagram of a prior art voltage reference.

FIGS. 5 through 8 show known electronic circuits that can be used as components in the preferred embodiment of driver 200. For example, FIG. 5 shows a simple voltage divider 500 that could be used for voltage reference 338. Voltage divider 500 includes a first resistor 510 and a second resistor 520 coupled in series between a first (Vcc) voltage source 530 and a second (ground) voltage source 540, an output terminal 550, and a capacitor 560. The voltage drops across resistors 510 and 520 are proportional to their respective resistances. For example, if Vcc=5 V, the resistance of resistor 510=1,000 ohms, and the resistance of resistor 520=4,000 ohms, then the voltage drop across resistor 510 will be 1 V, and the voltage at output terminal 550 will be 4 V. By adjusting the values of resistors 510 and 520, any voltage between Vcc and ground can be asserted on output terminal 550. Capacitor 560 provides voltage stability at output terminal 550.

Figure 6:
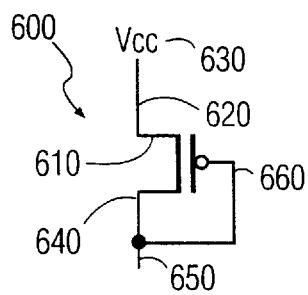
FIG. 6 is a schematic diagram of an alternate prior art voltage reference.

FIG. 6 shows a diode-connected PMOS transistor 610 that could be used for voltage reference 326. Transistor 610 has a source terminal 620 coupled to a first supply terminal 630, a drain terminal 640 coupled to an output terminal 650, and a gate terminal 660 coupled to the source terminal 640. When there is only a negligible amount of drain current flowing through transistor 610, the output terminal 650 will stabilize at approximately the threshold voltage of transistor 610.

Figure 7:
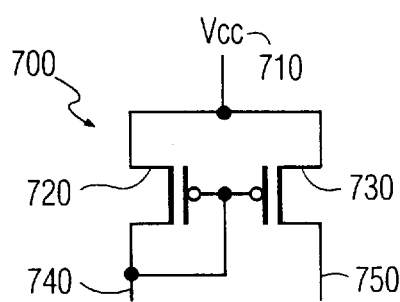
FIG. 7 is a schematic diagram of a prior art active load.

FIG. 7 shows a known active load 700 that could be substituted for resistors 328 and 330. Active load 700 includes a voltage supply terminal 710, first and second PMOS transistors 720 and 730, and first and second output terminals 740 and 750. First PMOS transistor 720 has a source terminal coupled to voltage supply terminal 710, a drain terminal coupled to output terminal 740, and a gate terminal coupled to its drain terminal. Second PMOS transistor 730 has a source terminal coupled to voltage supply terminal 710, a drain terminal coupled to output terminal 750, and a gate terminal coupled to the gate terminal of transistor 720 and, therefore, also to output terminal 740.

In this diode-connected configuration, the drain-source voltage of transistor 720 depends on the amount of drain current. When more current is drawn from the first output terminal 740, through transistor 720, the voltage on first output terminal 740 decreases, as does the voltage on the connected gates of transistors 720 and 730. The decreased voltage on the gate of transistor 730 causes more current to be provided to a load via second output terminal 750, causing the voltage on second output terminal 750 to rise until the drain-source voltage on transistor 730 approaches 0 V, or in other words, until the voltage on output terminal 750 approaches Vcc. If less current is drawn from the first output terminal 740, through transistor 720, the voltage on first output terminal 740 increases, as does the voltage on the connected gates of transistors 720 and 730. The increased voltage on the gate of transistor 730 causes less current to flow through transistor 730, decreasing the voltage on output terminal 750.

Figure 8:
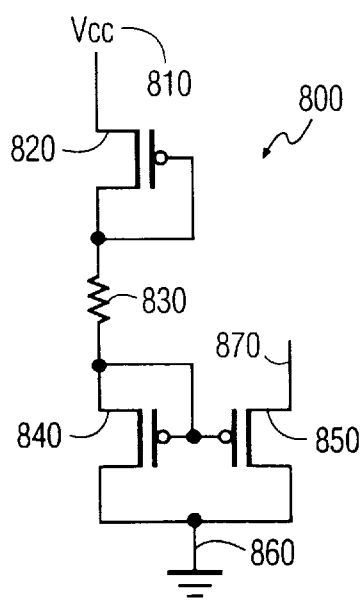
FIG. 8 is a schematic diagram of a prior art current reference.

FIG. 8 shows a known current reference 800 that could be used for current reference 336. Current reference 800 includes a first voltage supply 810, a PMOS transistor 820, a resistor 830, a pair of NMOS transistors 840 and 850, a second voltage supply 860, and an input terminal 870. PMOS transistor 820 has a source terminal coupled to first voltage supply 810, a drain terminal coupled to one terminal of resistor 830, and a gate terminal coupled to its drain terminal. NMOS transistor 840 has a drain terminal coupled to the second terminal of resistor 830, a source terminal coupled to second voltage supply 860, and a gate terminal tied to its drain terminal. NMOS transistor 850 has a gate terminal coupled to the gate terminal of transistor 840, a source terminal coupled to the second voltage supply 860, and a drain terminal coupled to input terminal 870.

Current reference 800 operates as a current mirror. PMOS transistor 820 is "diode-connected," with its gate terminal coupled to its drain terminal, and together with resistor 830 provides a reference current (I) which flows through transistor 840. The reference current (I) can be controlled by modifying the resistance of resistor 830. The current (I) flowing through transistor 840 determines the drain voltage of transistor 840 and, since they are coupled together, the gate voltages of transistors 840 and 850. Therefore, assuming transistors 840 and 850 have common characteristics, transistor 850 will pass the same amount of current as transistor 840.

The invention has been described with reference to a preferred embodiment, providing specific details for the sake of clarity. Those skilled in the art, however, will understand that the invention may be practiced apart from these specific details. For example, it is well-known to build complimentary circuits by exchanging PMOS and NMOS devices and reversing the circuit's current flow. Additionally, a PMOS device which is being used as a switch can be replaced by an NMOS device with an inverted input, and vice versa. Furthermore, devices such as transistors 308, 314, 320, and 324 could be replaced by any other type of switching device, including but not limited to bi-polar transistors.

Another detail that is not required to practice the invention is the disposition of devices used to limit current or voltage, such as output voltage limiter 216 and current limiter 218. Devices which limit current flow can operate either upstream or downstream from the controlled device. Thus, rather than coupling voltage limiter 216 between first output driver 214 and first supply terminal 208 as shown in FIG. 2, voltage limiter 216 could just as well be disposed between first output driver 214 and second supply terminal 210.

It will also be understood by those skilled in the art that many of the elements of the present invention serve more than one purpose. For example, referring to FIG. 2, enabling voltage generator 220, responsive to the voltage on node 236, asserts an enabling signal on node 246 which enables the static stage. The signal asserted by enabling voltage generator 220, however, also causes stabilization voltage generator 217 to assert a stabilization signal on node 248. Thus, enabling voltage generator 220 could be viewed as a component of stabilization voltage generator 217.

Therefore, as used in this specification and in the appended claims, the term "coupled" should not be interpreted literally to require a direct connection of the indicated elements. To do so would unnecessarily limit the scope of the invention based on arbitrary lines of demarcation drawn around devices serving more than one function. Accordingly, since enabling voltage generator 220 could be considered a component of stabilization voltage generator 217, and stabilization voltage generator 217 is coupled to output voltage limiter 216, then enabling voltage generator 220 is considered to be coupled to output voltage limiter 216.

Similarly, when a device is said to perform some function "responsive to" a certain signal, it will be understood by those skilled in the art that the device is also responsive to the devices or other signals responsible for the generation of that certain signal. For example, enabling voltage generator 220 asserts, responsive to a signal on node 236, an enabling voltage on node 246. However, since first output driver 214 asserts the signal on node 236 responsive to the signal on node 235, it is clear that enabling voltage generator 220 is also responsive to the signal on node 235.

It will also be obvious to one skilled in the art that, while some elements of the invention have been broken into sub-elements for the sake of clarity, this is not necessary to the practice of the invention. For example, in the description of the preferred embodiment, the means for enabling the static stage included enabling voltage generator 220 and enabler 254, coupled by enabling terminal 224. It is clear, however, that enabling voltage generator 220 and enabler 254 are simply sub-components of the enabling means, and that enabling terminal 224 could be any electrically conductive path.

Finally, while the preferred embodiment driver 200 asserts a low output voltage responsive to a low input voltage and a high output voltage in response to a high input voltage, those skilled in the art will understand that driver 200 could easily be modified to provide a high output voltage responsive to a low input voltage and vice-versa. Such a modification could be done as simply as by interposing an inverter between driver input terminal 206 and first output driver 214. Therefore, the term "driver" as used in this specification and appended claims should be interpreted to include inverting as well as non-inverting drivers.

What is claimed is:

1. An internal referenced output voltage driver, comprising:
   a first supply terminal for connecting to a first voltage supply;
   a second supply terminal for connecting to a second, lower voltage supply, the first and second voltage supply together defining a single power supply;
   a driver input terminal for receiving a input signal;
   a driver output terminal for providing an output signal;
   a dynamic stage including an enabling terminal, said dynamic stage being coupled to said first supply terminal, said second supply terminal, said driver input terminal and said driver output terminal, for asserting, responsive to a first input voltage on said driver input terminal, a first output voltage on said driver output terminal, and for asserting, responsive to a second input voltage on said driver input terminal, an enabling voltage on said enabling terminal; and
   a static stage, coupled to said first supply terminal, said second supply terminal, said driver output terminal and said enabling terminal, for asserting, responsive to said enabling voltage on said enabling terminal, a second output voltage on said driver output terminal, the second output voltage being less than the voltage of the first voltage supply and greater than the voltage of the second voltage supply.

2. The driver of claim 1, wherein:
   said dynamic stage comprises
      a first driving means, coupled to said first supply terminal, said second supply terminal, said driver input terminal and said driver output terminal, for asserting, responsive to a first input voltage on said driver input terminal, the first output voltage on said driver output terminal; and
      an enabling voltage generating means, responsive to a first transitional voltage on said driver output terminal, for asserting said enabling voltage onto said enabling terminal; and
   said static stage comprises
      a second driving means, coupled to said first supply terminal, said second supply terminal and said driver output terminal, for asserting the second output voltage on said driver output terminal, and
      an enabling means, coupled to said enabling terminal, for enabling, responsive to said enabling voltage being asserted on said enabling terminal, said second driving means to assert said second output voltage on said driver output terminal.

3. The driver of claim 2, wherein said static stage further comprises feedback means, having a first terminal coupled to said driver output terminal and a second terminal coupled to said second driving means, for providing feedback from said driver output terminal to said second driving means.

4. The driver of claim 3, wherein said dynamic stage further comprises voltage limiting means, coupled to said first driving means and said driver output terminal, for limiting, responsive to a second transitional voltage on said driver output terminal, the voltage asserted by said first driving means on said driver output terminal.

5. The driver of claim 4, wherein:
   said dynamic stage further comprises
      stabilization voltage generating means, coupled to said driver output terminal and having a stabilizer terminal, for asserting, responsive to a third transitional voltage on said driver output terminal, a stabilizing voltage on said stabilizer terminal; and
   said static stage further comprises stabilization means, coupled to said stabilizer terminal and to said second driving means, for stabilizing, responsive to said stabilizing voltage, said second driving means.

6. The driver of claim 5, wherein said dynamic stage further comprises current limiting means, coupled to said first driving means and said enabling voltage generating means, for limiting current to said enabling voltage generating means, responsive to said second input voltage on said driver input terminal.

7. The driver of claim 6, wherein said static stage further comprises protection means, coupled to said driver output terminal and said second supply terminal, for biasing said driver output terminal toward said second output voltage, should said driver terminal overshoot said second output voltage.

8. The driver of claim 3, wherein said feedback means comprises:
   a differential amplifier, having a first input terminal coupled to said driver output terminal, a second input terminal, and an output terminal coupled to said second driving means; and a voltage reference, having a first terminal coupled to said second supply terminal, and a second terminal coupled to said second input terminal of said differential amplifier.

9. The driver of claim 8, wherein said differential amplifier comprises:
a first resistor, having a first terminal, coupled to said first supply terminal, and a second terminal;
a second resistor, having a first terminal, coupled to said first supply terminal, and a second terminal coupled to said output terminal of said differential amplifier;
a first field-effect transistor, having a drain terminal coupled to said second terminal of said first resistor, a gate terminal coupled to said first input terminal of said differential amplifier, and a source terminal;
a second field-effect transistor, having a drain terminal coupled to said output terminal of said differential amplifier, a gate terminal coupled to said second input of said differential amplifier, and a source terminal coupled to said source terminal of said first field-effect transistor; and
a current reference, having a first terminal coupled to said source terminals of said first and second field-effect transistors, and a second terminal coupled to said second supply terminal.

10. The driver of claim 2, wherein said first driving means comprises:
a first inverter, having an input terminal coupled to said driver input terminal, and an output terminal; and
a second inverter, having an input terminal coupled to said output terminal of said first inverter, and an output terminal coupled to said driver output terminal.

11. The driver of claim 10, wherein said second driving means comprises a transconductance device, having a first terminal coupled to said first supply terminal, a second terminal coupled to said driver output terminal, and a control terminal biased to cause said second driving means to assert said second output voltage on said driver output terminal.

12. The driver of claim 11, wherein:
said enabling voltage generating means comprises a third inverter, having an input terminal coupled to said driver output terminal, and an output terminal; and
said enabling means comprises a first switching device having a first contact terminal coupled to said second terminal of said transconductance device, a second contact terminal coupled to said driver output terminal, and a control terminal coupled to said output terminal of said third inverter.

13. The driver of claim 12, wherein said static stage further comprises feedback means, having a first terminal coupled to said driver output terminal and a second terminal coupled to said control terminal of said transconductance device, for providing feedback from said driver output terminal to said second driving means.

14. The driver of claim 3, wherein said feedback means comprises:
a differential amplifier, having a first input terminal coupled to said driver output terminal, a second input terminal, and an output terminal coupled to said control terminal of said transconductance device; and
a first reference voltage supply, having a first terminal coupled to said second supply terminal, and a second terminal coupled to said second input terminal of said differential amplifier.

15. The driver of claim 14, wherein said dynamic stage further comprises voltage limiting means, coupled to said first driving means and said driver output terminal, for limiting, responsive to a second transitional voltage on said driver output terminal, the voltage asserted by said first driving means onto said driver output terminal.

16. The driver of claim 15, wherein said voltage limiting means comprises:
a fourth inverter, having an input terminal coupled to said output terminal of said third inverter, and an output terminal; and
a second switching device, having a first contact terminal coupled to said first supply terminal, a second contact terminal coupled to said first driving means, and a control terminal coupled to said output terminal of said fourth inverter.

17. The driver of claim 16, wherein:
said dynamic stage further comprises
stabilization voltage generating means, coupled to said driver output terminal and having a stabilizer terminal, for asserting, responsive to a third transitional voltage on said driver output terminal, a stabilizing voltage on said stabilizer terminal; and
said static stage further comprises stabilization means, coupled to said stabilizer terminal and to said second driving means, for stabilizing, responsive to said stabilizing voltage, said second driving means.

18. The driver of claim 17, wherein said stabilization means comprises:
a second reference voltage supply, having a first terminal coupled to said first supply terminal, and a second terminal; and
a third switching device, having a first contact terminal coupled to said second terminal of said second reference voltage supply, a second contact terminal coupled to said control terminal of said transconductance device, and a control terminal coupled to said stabilizer terminal.

19. The driver of claim 18, wherein said dynamic stage further comprises current limiting means, coupled to said first driving means and said enabling voltage generating means, for limiting current to said enabling voltage generating means, responsive to said second input voltage on said driver input terminal.

20. The driver of claim 19, wherein said current limiting means comprises:
a NOR gate, having a first input coupled to said first driving means, a second input coupled to said output terminal of said third inverter, and an output terminal; and
a fourth switching device, having a first contact terminal coupled to said first supply terminal, a second contact terminal coupled to said enabling voltage generating means, and a control terminal coupled to said output terminal of said NOR gate.

21. The driver of claim 20, wherein said static stage further comprises protection means, coupled to said driver output terminal and said second supply terminal, for biasing said driver output terminal toward said second output voltage, should said driver terminal overshoot said second output voltage.

22. The driver of claim 21, wherein said protection means comprises a current sink.

23. The driver of claim 12, wherein said second inverter comprises:
a first NMOS transistor, having a drain terminal coupled to said driver output terminal, a source terminal coupled to said second supply terminal, and a gate terminal coupled to said output terminal of said first inverter; and a first PMOS transistor, having a source terminal coupled to said first supply terminal, a drain terminal coupled to said drain terminal of said first NMOS transistor, and a gate terminal coupled to said output terminal of said first inverter.

24. The driver of claim 23, wherein said transconductance device comprises a second PMOS transistor, having a source terminal coupled to said first supply terminal, a drain terminal coupled to said driver output terminal, and a gate terminal biased to cause said second driving means to assert said second output voltage on said driver output terminal.

25. The driver of claim 24, wherein:

said third inverter comprises
- a third PMOS transistor, having a source terminal coupled to said first supply terminal, a drain terminal coupled to said output terminal of said third inverter, and a gate terminal coupled to said driver output terminal, and
- a second NMOS transistor, having a drain terminal coupled to said output terminal of said third inverter, a source terminal coupled to said second supply terminal, and a gate terminal coupled to said driver output terminal; and said first switching device comprises a fourth PMOS transistor, having a source terminal coupled to said drain terminal of said second PMOS transistor, a drain terminal coupled to said driver output terminal, and a gate terminal coupled to said output terminal of said third inverter.

26. The driver of claim 25, further comprising feedback means for providing feedback from said driver output terminal to said second driving means, said feedback means comprising:

- a first resistor, having a first terminal, coupled to said first supply terminal, and a second terminal;
- a second resistor, having a first terminal, coupled to said first supply terminal, and a second terminal coupled to said gate terminal of said second PMOS transistor;
- a first field-effect transistor, having a drain terminal coupled to said second terminal of said first resistor, a gate terminal coupled to said driver output terminal, and a source terminal;
- a second field-effect transistor, having a drain terminal coupled to said gate terminal of said second PMOS transistor, a gate terminal, and a source terminal coupled to said source terminal of said first field-effect transistor;
- a first current reference, having a first terminal coupled to said source terminals of said first and second field-effect transistors, and a second terminal coupled to said second supply terminal; and
- a first voltage reference, having a first terminal coupled to said gate terminal of said second field-effect transistor, and a second terminal coupled to said second supply terminal.

27. The driver of claim 26, further comprising voltage limiting means for limiting the voltage asserted onto said driver output terminal by said first driving means, said voltage limiting means comprising:

- a fourth inverter, having an input terminal coupled to said output terminal of said third inverter, and an output terminal; and
- a fifth PMOS transistor, having a source terminal coupled to said first supply terminal, a drain terminal coupled to said source terminal of said first PMOS transistor, and a gate terminal coupled to said output terminal of said fourth inverter.

28. The driver of claim 27, further comprising stabilization means for stabilizing said second driving means when said static stage is not enabled, said stabilizing means comprising:

- a reference voltage supply having a first terminal coupled to said first supply terminal, and a second terminal; and
- a sixth PMOS transistor, having a source terminal coupled to said second terminal of said reference voltage supply, a drain terminal coupled to said gate terminal of said second PMOS transistor, and a gate terminal coupled to said output terminal of said fourth inverter.

29. The driver of claim 28, further comprising current limiting means for limiting current to said enabling voltage generating means, said current limiting means comprising:

- a NOR gate, having a first input terminal coupled to said output terminal of said third inverter, a second input terminal coupled to said output of said first inverter, and an output terminal; and
- a seventh PMOS transistor, having a source terminal coupled to said first supply terminal, a drain terminal coupled to said source terminal of said third PMOS transistor, and a gate terminal coupled to said output terminal of said NOR gate.

30. The driver of claim 29, further comprising a second current reference having a first terminal coupled to said driver output terminal, and a second terminal coupled to said second supply terminal.

31. The driver of claim 2, further comprising voltage limiting means, coupled to said first driving means and said driver output terminal, for limiting, responsive to a second transitional voltage on said driver output terminal, the voltage asserted by said first driving means onto said driver output terminal.

32. The driver of claim 31, wherein said voltage limiting means comprises:

- an inverter, having an input terminal coupled to said enabling terminal, and an output terminal; and
- a switching device, having a first contact terminal coupled to said first supply terminal, a second contact terminal coupled to said first driving means, and a control terminal coupled to said output terminal of said inverter.

33. The driver of claim 32, wherein said switching device comprises a PMOS transistor, having a source terminal coupled to said first supply terminal, a drain terminal coupled to said first driving means, and a gate terminal coupled to said output terminal of said inverter.

34. The driver of claim 2, further comprising stabilization means, coupled to said enabling terminal and to said second driving means, for stabilizing, responsive to a stabilizing voltage on said enabling terminal, said second driving means.

35. The driver of claim 34, wherein said stabilization means comprises:

- an inverter, having an input terminal coupled to said enabling terminal, and an output terminal;
- a voltage reference, having a first terminal coupled to said first supply terminal, and a second terminal; and
- a switching device, having a first contact terminal coupled to said second terminal of said voltage reference, a second contact terminal coupled to said second driving means, and a control terminal coupled to said output terminal of said inverter.

36. The driver of claim 35, wherein said switching device comprises a PMOS transistor having a source terminal coupled to said second terminal of said voltage reference, a drain terminal coupled to said second driving means, and a gate terminal coupled to said output terminal of said inverter.

37. The driver of claim 2, further comprising current limiting means, coupled to said first driving means and said enabling voltage generating means, for limiting current to said enabling voltage generating means, responsive to said second input voltage on said driver input terminal.

38. The driver of claim 37, wherein said current limiting means comprises:
   a NOR gate, having a first input terminal coupled to said first driving means, a second input terminal coupled to said enabling terminal, and an output terminal; and
   a switching device, having a first contact terminal coupled to said first supply terminal, a second contact terminal coupled to said enabling voltage generating means, and a control terminal coupled to said output terminal of said NOR gate.

39. The driver of claim 38, wherein said switching device comprises a PMOS transistor, having a source terminal coupled to said first supply terminal, a drain terminal coupled to said enabling voltage generating means, and a gate terminal coupled to said output terminal of said NOR gate.

40. The driver of claim 2, further comprising protection means, coupled to said driver output terminal and said second supply terminal, for biasing said driver output terminal toward said second output voltage, should said driver terminal overshoot said second output voltage.

41. The driver of claim 40, wherein said protection means comprises a current reference, having a first terminal coupled to said driver output terminal, and a second terminal coupled to said second supply terminal.

42. An internal referenced output voltage driver, comprising:
   a first supply terminal for connecting to a first voltage supply;
   a second supply terminal for connecting to a second, lower voltage supply;
   a driver input terminal for receiving an input signal;
   a driver output terminal for providing an output signal;
   a first driving means, coupled to said first supply terminal, said second supply terminal, said driver input terminal and said driver output terminal, for asserting responsive to a first input voltage on said driver input terminal, a first output voltage on said driver output terminal at or near the voltage of the second voltage supply;
   a second driving means, coupled to said first supply terminal, said second supply terminal and said driver output terminal, for asserting a second output voltage on said driver output terminal, the second output voltage being greater than the first output voltage and less than the voltage of the first voltage supply; and
   an enabling means, coupled between said first and second driving means, for enabling, responsive to a second input voltage on said driver input terminal, said second driving means to assert said second output voltage onto said driver output terminal.

43. The driver of claim 42, further comprising a feedback means, coupled between said driver output terminal and said second driving means, for providing feedback from said driver output terminal to said second driving means, to stabilize said driver output terminal at said second output voltage.

44. The driver of claim 43, further comprising a voltage limiting means, coupled to said first driving means, for limiting, responsive to said second input voltage, the voltage asserted on said driver output terminal by said first driving means.

45. The driver of claim 44, further comprising a current limiting means, coupled to said enabling means for limiting the current supplied to said enabling means, responsive to said second input voltage being asserted on said driver input terminal.

46. The driver of claim 45, further comprising protection means, coupled between said driver output terminal and said second supply terminal, for pulling the voltage on said driver output terminal toward the voltage on said second supply terminal, when the voltage on said driver output terminal substantially overshoots the second output voltage.

47. An internal referenced output voltage driver, comprising:
   first and second supply terminals for connection to only a single power supply having only a first supply voltage and a second, lower supply voltage;
   a driver input terminal for receiving an input signal;
   a driver output terminal for providing an output signal;
   a first driver responsive to a first input voltage on said input terminal to assert a first output voltage on said driver output terminal;
   a second driver, and a feedback device coupled to said second driver, which together assert a second output voltage at said driver output terminal equal to a reference voltage input to the feedback device, the reference voltage being between the first and second supply voltages; and
   an enabler coupled to said first and second drivers to enable said second driver and said feedback device to assert the second voltage at said driver output terminal in response to a second input voltage present at said driver input terminal,
   the first and second drivers, the feedback device and the enabler being coupled to the first and second supply terminals and powered only by the single power supply.

48. A driver according to claim 47, wherein said feedback device comprise a differential amplifier having a first input terminal coupled to said driver output terminal, a second input terminal which receives the reference voltage, and an output terminal coupled to said second driver.

* * * * *